United States Patent
Cuthbertson et al.

(10) Patent No.: US 7,660,683 B2
(45) Date of Patent: Feb. 9, 2010

(54) WAVEFORM DETECTION, IN PARTICULAR FOR THE REPRESENTATION OF THE ROOT MEAN SQUARE OF A WAVEFORM

(76) Inventors: Brian Cuthbertson, 2 Rosemont Road, Hampstead, London NW 3 6NE (GB); Peter Gordon Davy, 2 Rosemont Road, Hampstead, London NW 3 6NE (GB)

(*) Notice: Subject to any disclaimer, the term of this patent is extended or adjusted under 35 U.S.C. 154(b) by 252 days.

(21) Appl. No.: 10/558,213

(22) PCT Filed: May 27, 2004

(86) PCT No.: PCT/GB2004/002255

§ 371 (c)(1),
(2), (4) Date: Aug. 28, 2006

(87) PCT Pub. No.: WO2004/106950

PCT Pub. Date: Dec. 9, 2004

(65) Prior Publication Data

US 2007/0063753 A1    Mar. 22, 2007

(30) Foreign Application Priority Data

May 30, 2003   (GB) ................................ 0312346.0

(51) Int. Cl.
*G01R 21/00* (2006.01)
(52) U.S. Cl. ..................... 702/61; 324/76.12
(58) Field of Classification Search ............ 702/60–61, 702/66, 70–74, 198–199; 324/76.12
See application file for complete search history.

(56) References Cited

U.S. PATENT DOCUMENTS 4,642,564 A * 2/1987 Hurley ....................... 324/132
5,495,245 A * 2/1996 Ashe .......................... 341/145
5,506,477 A   4/1996 Davy et al.

(Continued)

OTHER PUBLICATIONS

Kitchin et al., "Circuit measures true-rms and average value", Sep. 26, 2002, EDN, www.edn.com, pp. 104-105.*

(Continued)

*Primary Examiner*—Eliseo Ramos Feliciano
*Assistant Examiner*—Mary C Baran
(74) *Attorney, Agent, or Firm*—Stroock & Stroock & Lavan LLP

(57) ABSTRACT

The instantaneous value of an intermediate waveform I is the instantaneous value of a unipolar waveform U multiplied through amplification by an upscaling factor UF of 1.5. A plateau value P is subtracted from the intermediate value I, and the result of this subtraction is multiplied by a multiplication factor MF of 0.6. The result of the multiplication is added to the plateau value P, which sum becomes an auxiliary waveform A. During the 'fall-below' periods F, the value of a combined waveform C is arranged to follow whichever is the highest of the auxiliary value A and the plateau value P. Outside the fall-below periods, the value of the combined waveform C follows whichever is the highest of the unipolar value U and the plateau value P. This combined waveform C has, for a given plateau level P, a narrower fall-below window. Phase-chopping thus has an effect on the power of the output signal over a greater range of the cycle than can be provided by the corresponding prior art arrangement.

8 Claims, 7 Drawing Sheets

U.S. PATENT DOCUMENTS 5,638,287 A * 6/1997 Appel .......................... 716/17
5,757,654 A * 5/1998 Appel .......................... 716/1

OTHER PUBLICATIONS

Analog Devices, Inc, "Low Cost, Low Power, True RMS-to-DC Converter", 1999, www.analog.com, pp. 1-8.*
International Search Report dated Oct. 26, 2004, in PCT/GB2004/002255.
Zhenhua Wang: "Novel Pseudo RMS Current Converter for Sinusoidal Signals Using a CMOS Precision Current Rectifier" IEEE Transactions on Instrumentation and Measurement, IEEE Inc. NY, vol. 39, No. 4, Aug. 1, 1990, pp. 670-671.
Bublitz, C.: "Echteffektiv-Digitalmultimeter im Vergleich Zum Mittelwert-DMM" Elektrotechnische Zeitschrift—ETZ VDE Verlag GMBH, Berlin, DE, vol. 117, No. 9, May 1, 1996, pp. 24-25.

* cited by examiner

WAVEFORM DETECTION, IN PARTICULAR FOR THE REPRESENTATION OF THE ROOT MEAN SQUARE OF A WAVEFORM

FIELD OF THE INVENTION

This invention relates to a method of generating a waveform, for use for example in providing information relating to a detected waveform or for use in stabilising the detected waveform. The invention relates also to corresponding apparatus. In particular, but not exclusively, the invention relates to algorithms for the representation of the root mean square (R.M.S.) value of certain detected (voltage) waveforms. The detected waveforms may be A.C., or cyclically varying unipolar. The representation may be used to stabilise or to present in some form this R.M.S. value.

BACKGROUND OF THE INVENTION

The advantages of powering lighting from a low voltage power supply are well known. Low voltage lighting is 'softer' and generally more preferable to high voltage lighting. The disadvantages of low voltage lighting are also well known. The main disadvantage is power loss in transmission cables linking a power supply with a lamp load. Lower voltage results in a higher current for a given power, resulting in greater power loss in the transmission cables. As well as the efficiency disadvantages of this, this creates control problems. In particular, the voltage drop across the transmission cables constitutes a significant proportion of the supply voltage. Consequently, it can be difficult to stabilise the supply voltage across the load at a required value from the power supply, which provides a source voltage. For the same reasons, it can be difficult to determine from the source voltage at the power supply what is the supply voltage across the light load. These problems apply also to the supply of low voltage power to loads other than light loads. The problems increase as the length of the transmission cables increases.

A known system 10 is illustrated in FIG. 1. Here, a power supply 11 provides a source voltage Vsource to a load 12 via a twin-core transmission cable 13. A voltage Vsupply across the load 12 is less than the power supply voltage Vsource by an amount equal to the voltage drop across the transmission cables 13 When the supply waveform Vsupply (which is shown in FIG. 2A, described below) across a resistive load 12 is subject to uncontrolled fluctuations due to uncontrolled changes in the power supply 11 (shown in FIG. 2C) or in the transmission of the Vsource waveform to the load 12, the RMS (root mean square) value of the Vsupply signal can destabilise. In this example, a 2 volt transmission-cable drop occurs between the peak of Vsource and the peak of Vsupply. This is known to be addressed in the prior art by providing appropriate alteration to the supply waveform Vsupply by controlled interventions in the transmission of the source waveform Vsupply to the load 12. This uses routing of Vsupply from the load to a detector, which provides information relating to Vsupply to an intervention controller, which controls intervention. This can stabilise the RMS value of the supply waveform Vsupply and thus stabilise the power output of the load 12, provided that the RMS value of the source waveform Vsource when attenuated by the transmission cables 13 is greater than the required stabilised value. This stabilisation is particularly useful for stabilising the light output of low voltage lamps, where fluctuations in voltage across the lamps due to changing volt drops in the transmission can present a problem.

In most cases involving stabilisation, the controlled intervention in the transmission of the source waveform Vsource to the load 12 is by an electronic switch, which temporarily interrupts the current to the load 12, thereby temporarily reducing the supply waveform voltage to zero or near zero, for a time necessary to reduce the RMS value of the supply waveform to the required stabilised level. This typically occurs in each half cycle of the V source waveform. The period of interruption for each half-cycle can be from the beginning of the half cycle until a phase-chopping angle at which conduction of current starts, as shown in FIG. 3A. This is known as leading edge dimming. Alternatively, interruption can occur from a phase-chopping angle at which conduction ceases until the end of the half cycle, as shown in FIG. 3B. This is known as trailing edge dimming. Alternatively, a combination of leading and trailing edge dimming can be used. In both leading and trailing edge technologies, the angular duration of the uninterrupted portion of the half-cycle, hereinafter called the conduction angle, is a measure which defines the angle of phase-chopping unambiguously. The RMS value increases as the conduction angle increases.

The Vsupply waveform is an example of a 'detected waveform' whose RMS value is required to be represented. The represented RMS value can be used to stabilise the waveform through interruption control, and can be used. for presentation. The detected waveform most commonly is sinusoidal AC (as in FIGS. 2A, 3A and 3B). As a precursor to applying the algorithm which generates this representation, this type of waveform is most conveniently rectified to produce a cyclically varying, positive unipolar 'rectified waveform', similar to the unipolar waveform U shown in FIGS. 2B and 3C. The algorithm acts on such a unipolar waveform U.

The rectified waveform may conveniently be derived from the AC detected waveform by full-wave bridge rectification, provided that the waveform voltage is high enough to make acceptable the inaccuracies necessarily caused by diode volt drops. A more accurate derivation is firstly to take one of the AC lines as ground so that the detected waveform is on the second AC line, to then generate by precision means an inversion (interchange of positive and negative values) of the detected waveform and finally use precision diode techniques to generate a "linear 'OR'" function by which the rectified waveform follows whichever at any instant is the more positive of the detected waveform and the inversion waveform. Unipolar detected waveforms, such as those shown in FIGS. 2B and 2C, can be acted on directly by the algorithm. Both unipolar detected waveforms and unipolar rectified waveforms (hereinafter referred to as the 'unipolar waveform') are acted on by the algorithm. It will however be understood that other arrangements are possible, in particular those in which different positive and negative implementations of parts or all of the algorithm can act respectively on positive and negative half cycles of the detected AC waveforms. If leading-edge dimming has been used to modify Vsource, resulting in a waveform as shown in FIG. 3A, the unipolar waveform U will appear as in FIG. 3C.

In known algorithms, a combined waveform C is derived from the unipolar waveform. The instantaneous value of this combined waveform, represented in FIG. 4, is derived by taking whichever is the more positive of the value of the unipolar waveform U (of FIG. 3C) and the value of a plateau waveform P, which is shown in FIG. 5. Here, the waveform values are represented as analogue voltages. The combined waveform C of FIG. 4 may be generated simply using precision diode techniques to give the required "linear 'OR'" function.

According to these algorithms, the mean value of the combined waveform C is taken as a representation of the RMS value of the detected waveform. This mean value clearly is not immediately available as an existing measurable value. Accordingly, a representation of the mean value (and thus of the RMS value), hereinafter called the 'mean representation' must be derived. There are numerous ways of automatically deriving the mean representation. The simplest mean representation is as a voltage value, referred to ground. This can be derived most simply by simple or multistage filtering of the combined waveform, which must be represented as a voltage waveform referred to ground, as in FIG. 4. Although this is the simplest, it has the downside of a lag in response caused by the filtering. The fastest derivation of the mean representation is achieved by deriving a value by integrating the combined waveform by analogue or digital means. The integration can be conducted every half cycle of a symmetric AC detected waveform, or every cycle of a unipolar or non-symmetric AC detected waveform.

The mean representation can, for stabilisation, be used to calculate or derive a correction to the conduction angle (or other controlled intervention in the transmission) for subsequent half cycles. For presentation, the mean representation can be used to control or update an analogue, digital or other presentation means of the RMS value. For stabilisation, an error signal is generated by comparing the mean representation with a set target level, representing the required stabilised level of the RMS value. This can be used to adjust the conduction angle or other parameter of a controlled intervention to the required level. For presentation, if a sufficiently constant mean representation is available over the whole of the half-cycle, it can control the presentation means directly. Otherwise, the error signal, generated by comparing the mean representation with the level of a store holding the presented RMS value, can be used to adjust the store to the new level of the mean representation.

A stabilising circuit is illustrated in FIG. 8A. Reference numerals are retained from FIG. 1 for like elements. In FIG. 8A, a power adjuster 23 is interposed close to the power supply 11 and in the circuit between the power supply 11 and the load 12. The power adjuster 23 interrupts the high (supply) current flowing from the power supply 11. Detector connection cables 20 carry Vsupply at a low current and substantially without attenuation to the power adjuster 23. The detector connection cables 20 thus provide the detected waveform. The power adjuster 23 has two other, low power, inputs, namely a plateau waveform P input and a set target level input 24. The output signal 28 of the power adjuster 23, which is an interrupted or phase-chopped version of Vsource, after attenuation by the transmission cables 13 becomes Vsupply.

FIG. 8B shows the power adjuster 23 in more detail. The detector connection cables 20 are connected to a rectifier 21, which provides precision rectification using diodes (not shown). The output of the rectifier 21 passes to a combiner 22, which combines the rectified unipolar signal U from the rectifier 21 with the plateau voltage P. The output of the combiner, C, (the combined waveform) is connected to a mean voltage calculator 25, which calculates the mean representation of the output of the combiner 22 in the manner described above, and provides a running mean signal at an output 26. An interrupt controller 27 receives the mean representation on the output 26, and uses it along with the set target level received at the set target level input 24 according to an algorithm to adjust the conduction angle such that Vsupply has the required RMS value.

The instantaneous value of the plateau waveform, hereinafter called the 'plateau value', is approximately constant over each half cycle, as shown in FIG. 5. However, the instantaneous value of the plateau waveform may be made to deviate from exact constancy in order to give a more accurate mean representation of the RMS value of detected waveforms conforming to certain shapes. For stabilisation, the instantaneous value of the plateau waveform is set at a value approximately equal to a factor of 0.78 times the value of the set target level. For presentation, the instantaneous value of the plateau waveform is set at a value, approximately equal to a factor of 0.78 times the value of the most recently derived mean representation. The plateau level is set at 0.78 times the value of the set target level because, at most phase-chopping angles, the average value of the combined waveform generated using this plateau level follows quite closely a multiple of the RMS value of the detected waveform. This multiple is close to but is not unity, and is compensated for by scaling either the set target (with plateau) level or the mean representation. If a zero plateau level were used, although there would be no fall-below window, the combined waveform would simply be a rectification of the detected waveform, meaning that its average value would follows the average value of the detected waveform instead of a multiple of its RMS value.

The plateau level setting factors may deviate from 0.78 for detected waveforms of certain shapes, for better matching of the mean representation to the RMS value of the detected waveform. The reasonably constant shape and value of the plateau waveform has been theoretically and empirically shown to give good matching for detected waveforms produced by phase-chopping Vsource waveforms approximating to a sine wave. For distorted waveforms modified by other types of intervention, other plateau waveforms may give the best matching.

In the most convenient arrangements where the waveforms are represented as analogue voltage waveforms referred to ground, the mean representation and any set target level are reasonably constant voltages referred to ground. Here, the reasonably constant plateau waveform P, similarly referred to ground, may be derived simply from whichever of the mean representation voltage and the set target level voltage is relevant, using an attenuating resistor network (not shown) returned to ground voltage.

A disadvantage with the above described algorithm is that changes in the unipolar waveform at values below the plateau waveform P value have no effect on the combined waveform C. For unipolar waveforms U whose shape when uninterrupted approximates a full-wave rectified sine wave, as shown in FIG. 6, the value of the unipolar waveform falls below the plateau waveform value P for periods at the beginning and end of each half cycle. During these 'fall-below' periods F, changes in phase-chopping angle are not detected. That is to say that if phase-chopping occurs within a fall below period, this has no effect on the resulting combined waveform and mean representation signal, since it is masked by the plateau waveform. In these instances, the mean representation may exhibit a small but significant deviation from the true RMS value. This deviation is called a 'detection error'. It may be as large as the contribution made to the total RMS value of the uninterrupted supply waveform during the early and/or late sections of the half cycle during which the absolute value of this waveform falls below the plateau value, depending on whether leading- or trailing-edge, or both, types of dimming are used. FIG. 7 shows for a leading edge dimmed waveform the maximum error possible E with P and −P indicating respectively the plateau value and its inversion.

SUMMARY OF THE INVENTION

According to a first aspect of the invention there is provided a method of generating a waveform, for use for example in providing information relating to a detected waveform or for use in stabilising the detected waveform, the method comprising:

upscaling the detected waveform or a waveform derived therefrom;

determining the difference between the upscaled waveform or a waveform derived therefrom and a plateau waveform or a waveform derived therefrom;

scaling the difference so determined; and combining the scaled difference with the plateau waveform or a waveform derived therefrom.

Preferably the combining is effected by addition.

According to a second aspect of the invention, there is provided apparatus for generating a waveform, for use for example in providing information relating to a detected waveform or for use in stabilising the detected waveform, the apparatus comprising:

upscaling means for upscaling the detected waveform or a waveform derived therefrom;

determining means for determining the difference between the upscaled waveform or a waveform derived therefrom and a plateau waveform or a waveform derived therefrom;

scaling means for scaling the difference so determined; and combining means for combining the scaled difference with the plateau waveform or a waveform derived therefrom to provide an auxiliary waveform.

Preferably the combining means provides the auxiliary waveform by adding the scaled difference to the plateau waveform or waveform derived therefrom.

The fall-below periods for the auxiliary waveform thus are reduced, thereby allowing more control of the output power over a greater proportion of the input wave cycle without a reduction in the plateau value.

Preferably the combining step comprises adding the scaled difference to the plateau waveform or waveform derived therefrom.

Embodiments of the present invention will now be described by way of example only, with reference to the accompanying drawings.

DETAILED DESCRIPTION OF THE PREFERRED EMBODIMENTS

Figure 1:
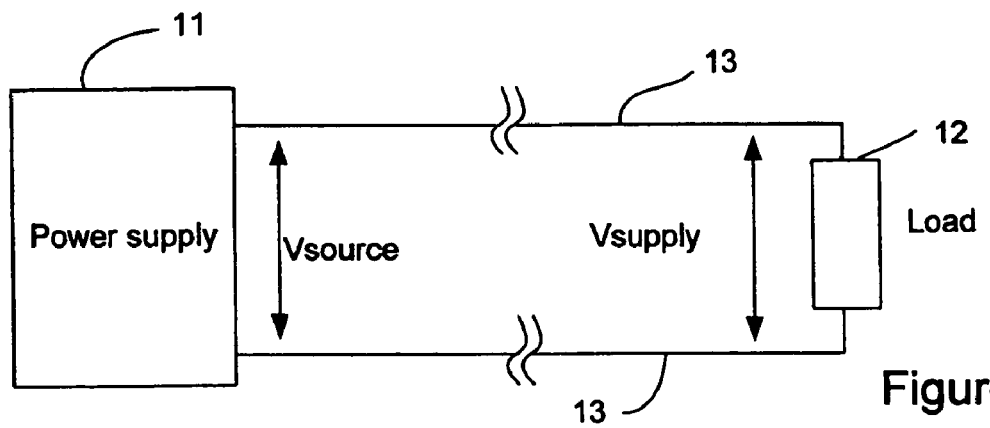
FIG. 1 is a schematic drawing of a lamp load and power supply system to which the invention can be applied.
Figure 2A:
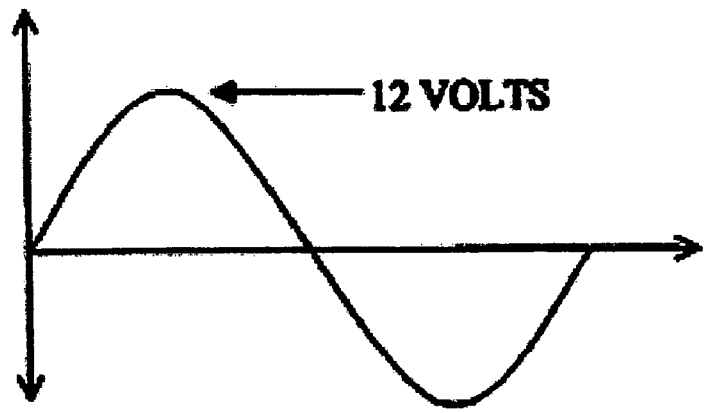
FIG. 2A to 2C, 3A to 3C and 4 to 7 are schematic drawings of waveforms which can be found at various points of the FIG. 1 system and which are used to describe various aspects of a prior art algorithm as well as embodiments of the invention.
Figure 2B:
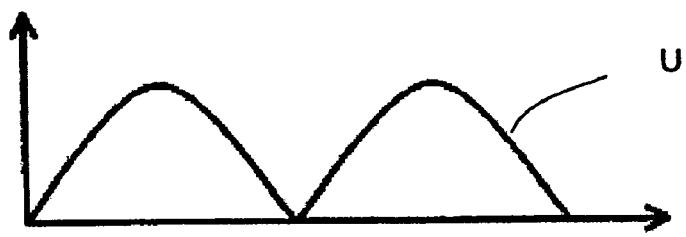
Figure 2C:
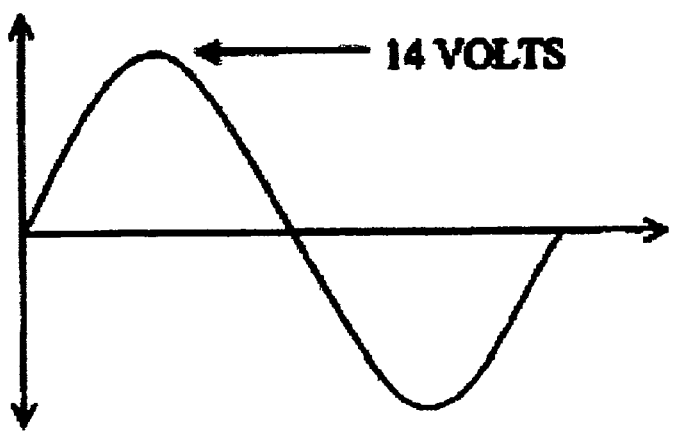
Figure 3A:
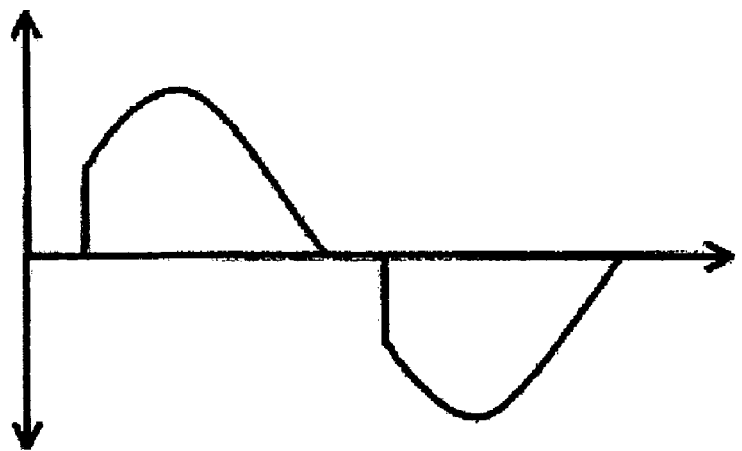
Figure 3B:
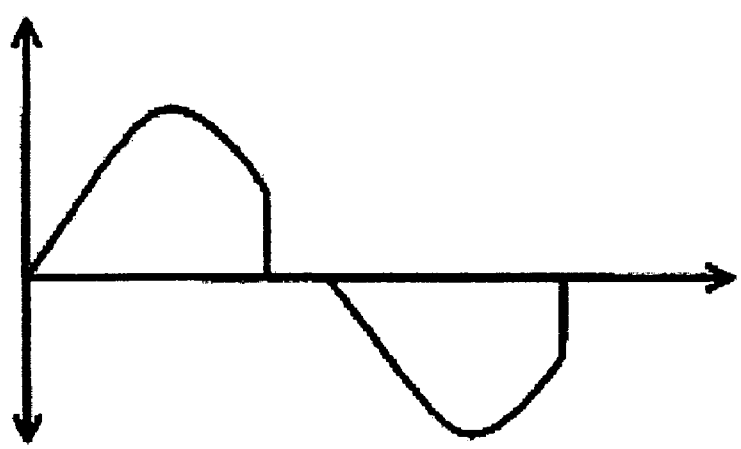
Figure 3C:
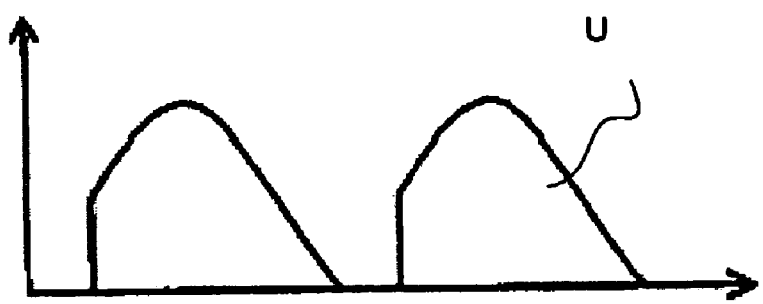
Figure 4:
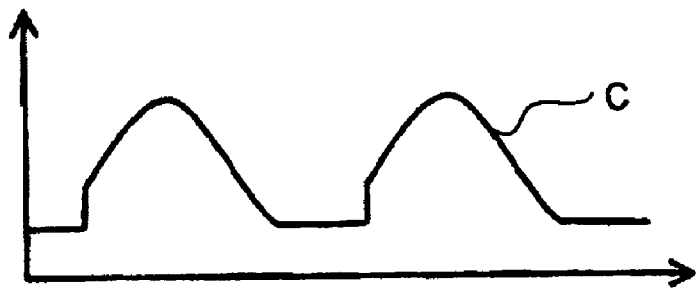
Figure 5:
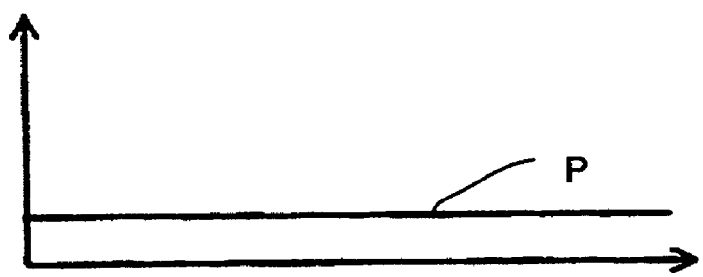
Figure 6:
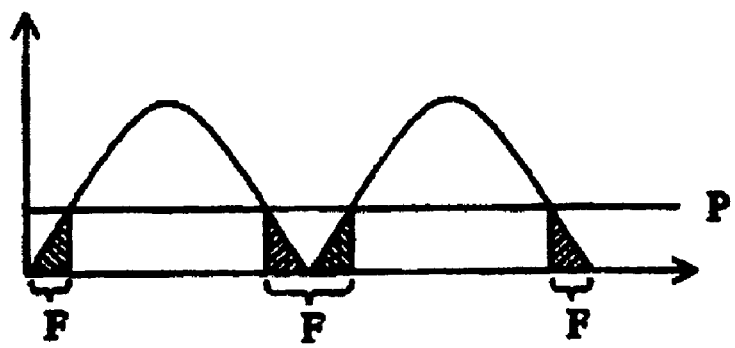
Figure 7:
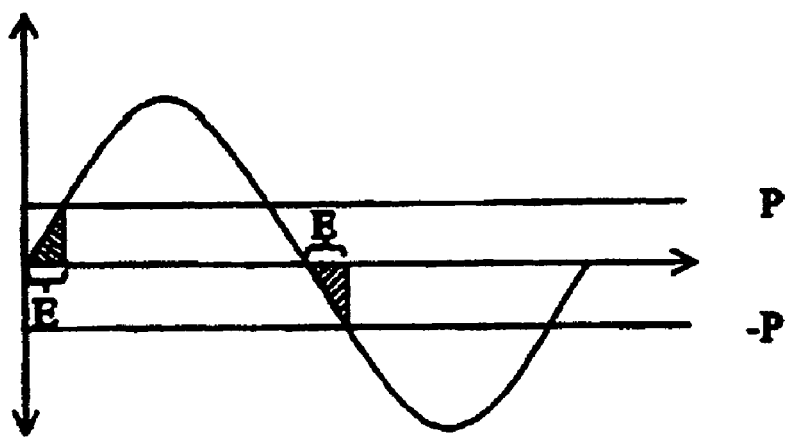
Figures 9, 10, 11:
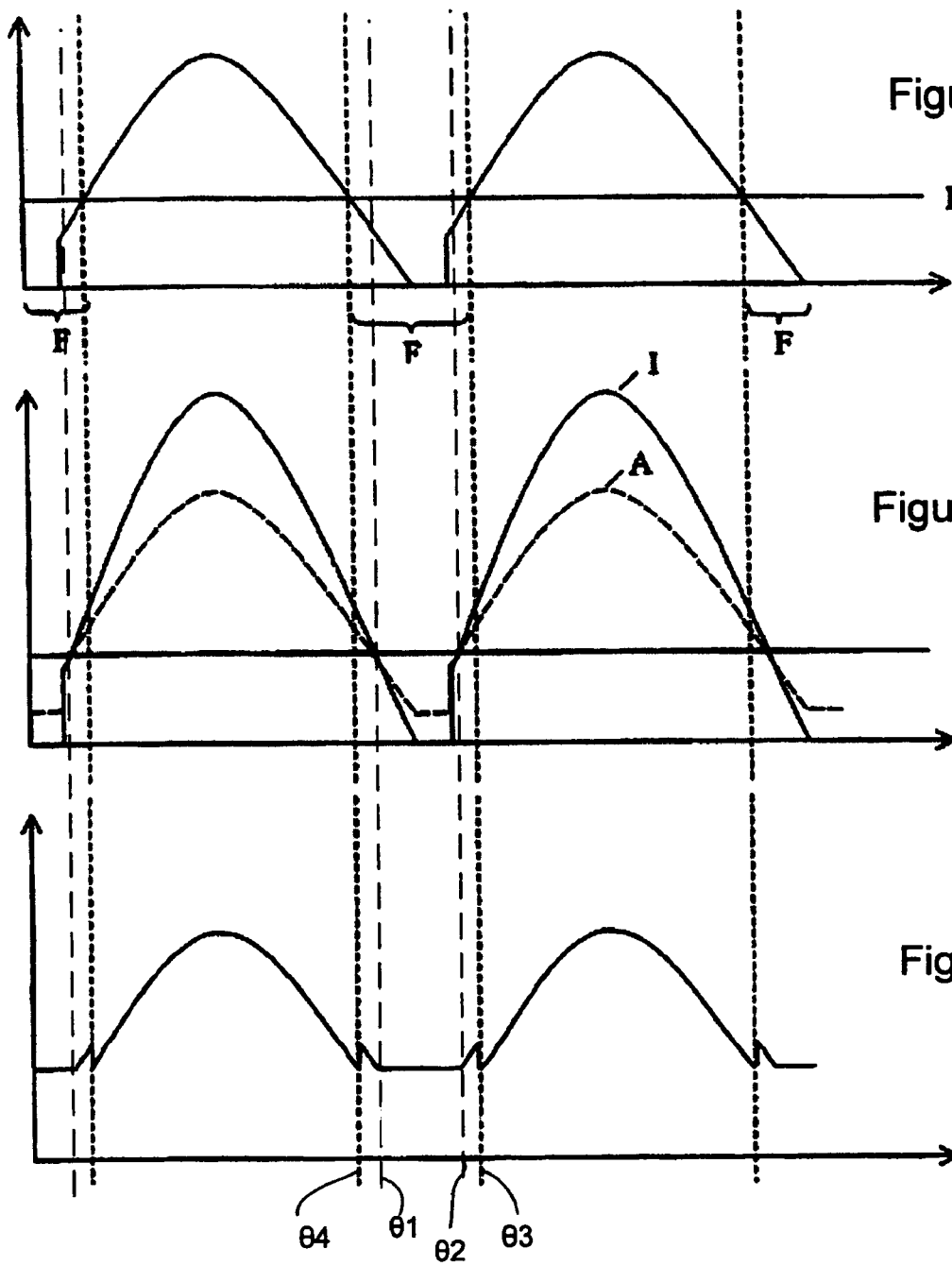
FIGS. 9 to 11 show waveforms used to describe operation of the invention.

In the first embodiment, the combined waveform (FIG. 4) of the above described system is modified in order to obviate a major part of the detection error. The combined waveform is modified so that the mean representation provides a better approximation to the R.M.S. value for all conduction angles. The combined waveform is modified in the embodiments only-during the 'fall-below' periods, which can be identified by simply comparing the instantaneous value of the unipolar waveform, for example that shown in FIG. 3C, and the instantaneous value of the plateau waveform, shown in FIG. 5. FIG. 9 illustrates a leading edge dimmed unipolar waveform with 'fall below' periods F defined by the constant plateau value P. During the fall-below periods F, a modified combined waveform is provided having an instantaneous value equal to whichever is the highest of the plateau value and the instantaneous value of an 'auxiliary waveform'. The auxiliary waveform A is shown in FIG. 10. The auxiliary waveform A is generated from the unipolar waveform and the plateau waveform P using an 'intermediate waveform', which is marked I in FIG. 10.

The instantaneous value of the intermediate waveform I is the instantaneous value of the unipolar waveform U, hereafter termed the unipolar value, shown in FIG. 9 multiplied by an upscaling factor UF. In this example, the upscaling factor UF is approximately equal to 1.5, although this is not essential. The upscaling factor UF can deviate from this value for example to provide greater accuracy where detected waveforms of other shapes are used, although other values can also be used for sinusoidal AC Vsource derived detected waveforms. Where the waveforms are voltages referred to ground, the intermediate waveform I may be generated by simple linear amplification referred to ground voltage of the unipolar waveform U.

The instantaneous value of the auxiliary waveform A, hereafter termed the auxiliary value, is calculated or derived by subtracting the plateau value P from the intermediate value I, and multiplying the result of this subtraction by a multiplication factor MF. In this example, the multiplication factor MF is approximately equal to 0.6, but it can take a different value, for example to provide greater accuracy when using different shaped detected waveforms. The result of the multiplication is added to the plateau value P, which sum becomes the auxiliary value of the auxiliary waveform A. Where the waveforms are voltages referred to ground, the auxiliary waveform A may be generated simply using a suitable attenuating resistor network connected between the intermediate waveform I voltage and the plateau waveform P voltage. In this case, the plateau voltage P acts as an on zero volt reference for attenuation equivalent to the above-described algorithm for calculating or deriving the auxiliary value.

During the 'fall-below' periods F, the value of a combined waveform is arranged to follow whichever is the highest of the auxiliary value A and the plateau value P. Outside the fall-below periods F, the value of the combined waveform is arranged to take that of the combined waveform of FIG. 4, i.e. it follows whichever is the highest of the unipolar value U and the plateau value P. The resulting combined waveform is shown in FIG. 11. This combined waveform has, for a given plateau level, a narrower fall-below window there defined by the angles θ1 and θ2. The effect of this is that phase-chopping has an effect on the mean representation signal 26 in FIG. 8B over a greater range of the cycle than can be provided by the corresponding prior art arrangement. Although in the example shown in FIGS. 9, 10 and 11 phase-chopping is shown to occur at a point which is masked by the plateau P, and thus would not effect any reduction in output power, it will be appreciated that a slight retardation in the phase-chopping angle to an angle between angle θ2 and angle θ3 would effect a reduction in the mean representation signal, whereas it would not in the corresponding prior art arrangement. This is achieved without changing the plateau level from that which gives the best matching overall. As discussed above, the plateau level determines the closeness of the matching of the average value of the combined waveform to a multiple of the RMS value of the detected waveform, so reducing the plateau level is undesirable.

Figure 8A:
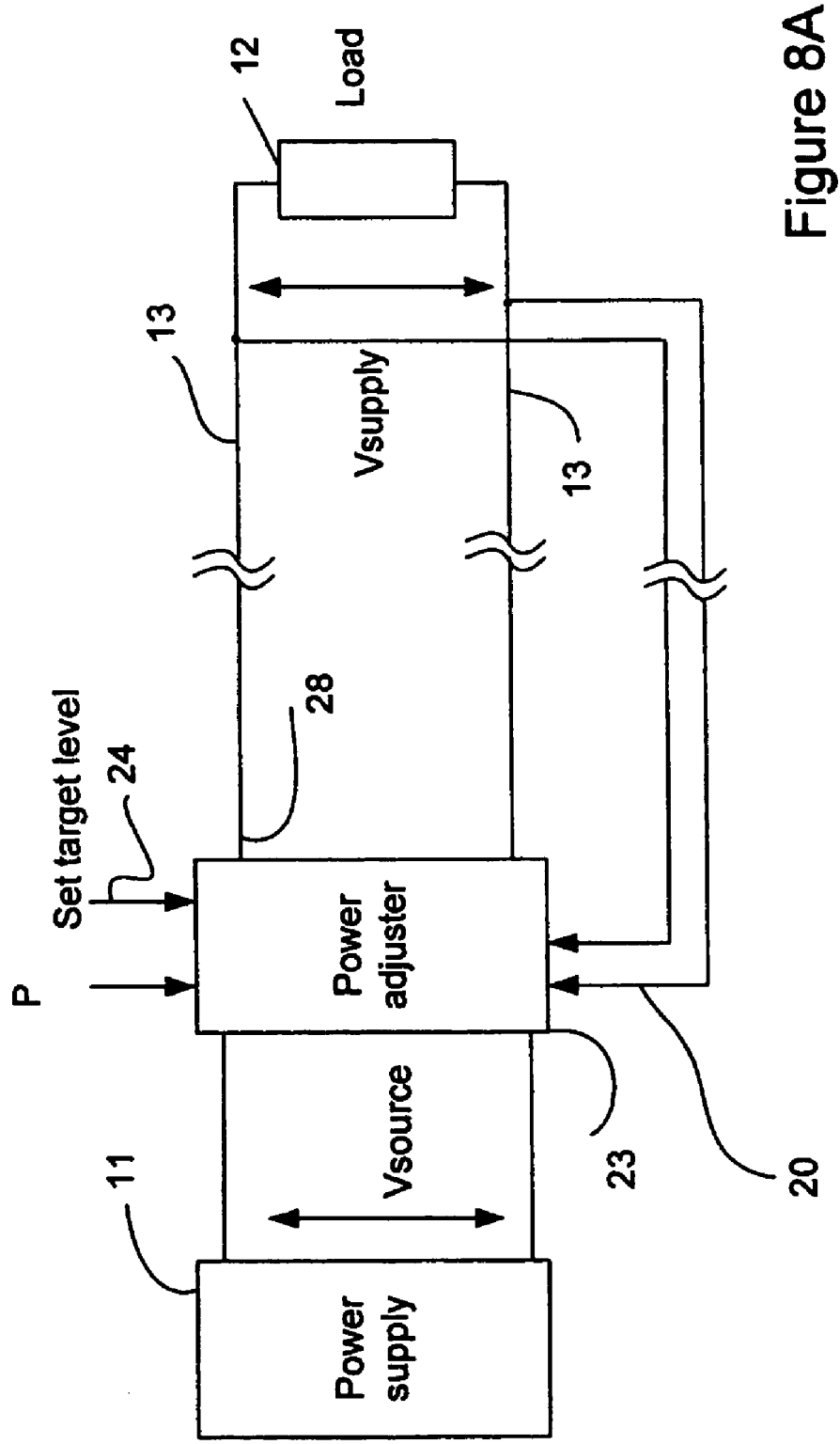
FIG. 8A shows a power adjuster interposed in the FIG. 1 system and operable according to the invention.
Figure 8B:
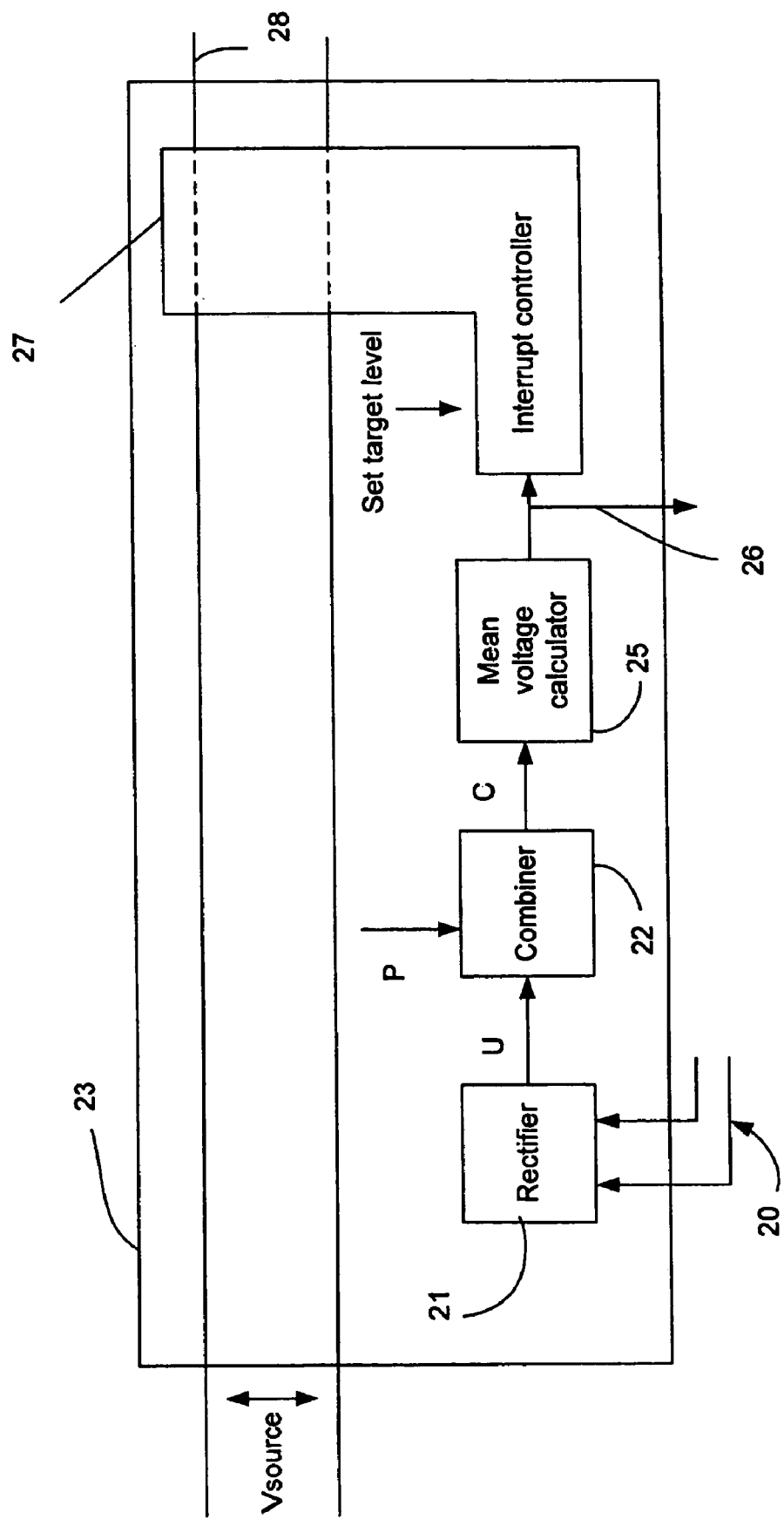
FIG. 8B shows in more detail the power adjuster of FIG. 8A.
Figure 12A:
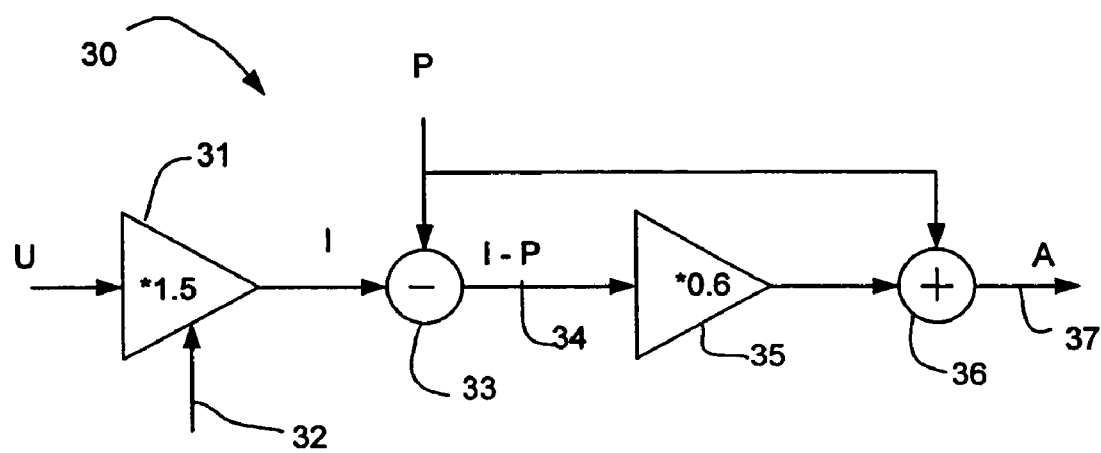
FIGS. 12A and 12B show a combiner useable in the FIG. 8B power adjuster and operable according to the invention.
Figure 12B:
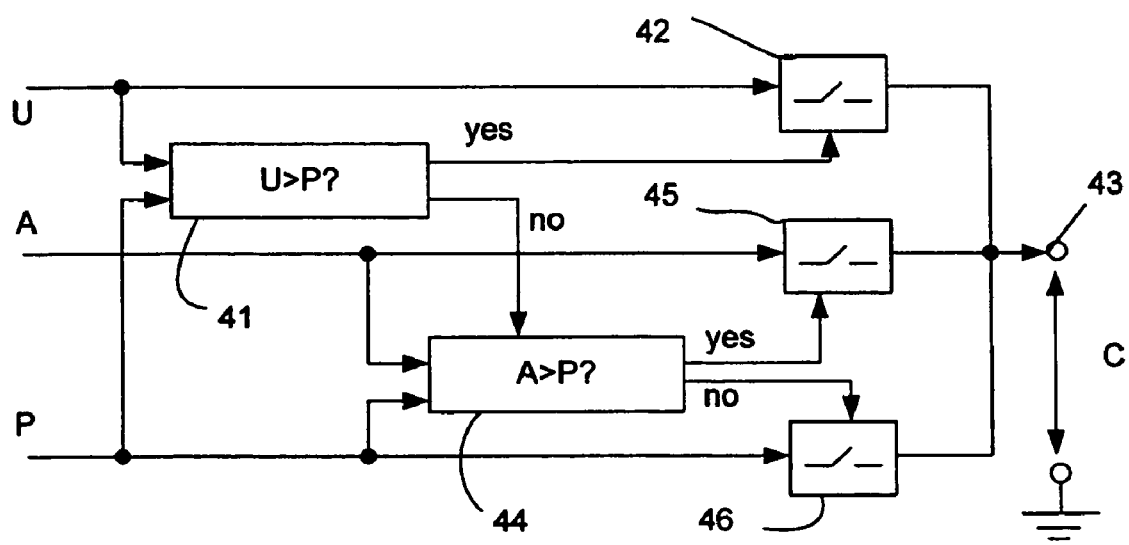

This operation can be performed by providing as the combiner 22 of FIG. 8B a combiner formed of the signal modifier 30 and the signal selector 40 shown schematically in FIGS. 12A and 12B. In FIG. 12A, a unipolar signal U is received from the rectifier 21 at an input of the signal modifier 30. A linear amplifier 31 is arranged to amplify the unipolar signal U, which effects upscaling of it. The amplifier here has a gain of 1.5, although it may be controllable by application of a suitable control signal to a optional control input 32. The amplifier provides as an output the intermediate signal I discussed above. A subtractor 33 provides at an output 34 a signal having an instantaneous value equal to the plateau value P subtracted from the intermediate value I. A further amplifier 35 having a gain of 0.6 downscales the signal provided by the subtractor 33, and provides the resulting product signal to a combiner or adder 36, which adds the plateau signal P to provide at an output 37 the auxiliary signal A discussed above. All of the signals processed by the signal modifier 30 are referred to ground potential.

In FIG. 12B, the selection circuit 40 utilises inputs of the unipolar signal U, the plateau signal P and the auxiliary signal A. A first logic device 41 determines continuously whether the unipolar value U is greater than the plateau value P, and if so provides an output signal which causes a first switch 42 to pass the unipolar signal to a selection circuit output 43. A combiner output signal C is provided between the selection circuit output 43 and ground potential G. When the unipolar value U is not greater than the plateau value P, i.e. during the fall-below periods F, the first logic device 41 switches the first switch 42 to an open position and instead activates a second logic device 44. Here, it is determined whether the auxiliary value A is greater than the plateau value P. If it is, the second logic device 44 controls a second switch 45 to pass the auxiliary waveform A to the selection circuit output 43. This occurs between angles θ2 and θ3 and between θ4 and θ1 in FIG. 11. Otherwise, the second logic device 44 controls a third switch 46 to pass the plateau waveform P to the selection circuit output 43. This occurs between angles θ1 and θ2 and θ1 in FIG. 11. The arrangement is such that only one of the switches 42, 45, 46 provides its respective input signal to the selection circuit output 43 at a given time. The result is an output Vcomb like that shown in FIG. 11.

It will however be understood that the invention may make use of additional and different 'fall-below' periods, similarly defined by additional plateau waveforms with different values. During these fall below periods, additional auxiliary waveforms may be produced using the same or different factors in the mathematical algorithm described above for the calculation or derivation of the auxiliary value. It is within the scope of the invention that the combined waveform may be further modified in such a way that its value follows the value of one of the additional auxiliary waveforms during some part or the whole of any of these additional 'fall-below' periods.

The invention claimed is:

1. Apparatus comprising:
    an upscaler configured to upscale a detected waveform or a waveform derived from a detected waveform to provide a first waveform;
    a determiner configured to determine a difference between the first waveform and a second waveform, the second waveform comprising a plateau waveform or a waveform derived from a plateau waveform, to provide a third waveform;
    a scaler configured to scale the third waveform to provide a fourth waveform; and
    a combiner configured to combine the fourth waveform with the second waveform to provide an auxiliary waveform;
    wherein, each of the detected waveform, plateau waveform, and auxiliary waveform has an instantaneous value at each of multiple points in time; and
    the apparatus is configured to provide, for power measurement, a fifth waveform, wherein:
        when the instantaneous value of the detected waveform exceeds the instantaneous value of the plateau waveform, the fifth waveform is provided with an instantaneous value comprising the instantaneous value of the detected waveform at a corresponding point in time, and
        when the instantaneous value of the detected waveform does not exceed the instantaneous value of the plateau waveform, the fifth waveform is provided with an instantaneous value comprising the largest of: a) the instantaneous value of the plateau waveform and b) the instantaneous value of the auxiliary waveform at a corresponding point in time.

2. Apparatus as claimed in claim 1, in which:
    the first waveform is the detected waveform;
    the second waveform is the plateau waveform; and
    the combiner is configured to provide the auxiliary waveform by combining the fourth waveform with the second waveform.

3. Apparatus as claimed in claim 1, further comprising a determiner configured to determine the power of the fifth waveform.

4. Apparatus as claimed in claim 3, comprising a phase chopper configured to phase chop a power source signal by an amount dependent on the power of the fifth waveform, and providing the phase-chopped signal to a load.

5. Apparatus as claimed in claim 1, wherein the upscaler comprises an amplifier.

6. Apparatus as claimed in claim 1, wherein the determiner comprises an attenuating resistor network.

7. Apparatus as claimed in claim 1, wherein the scaler comprises an attenuating resistor network.

8. Apparatus as claimed in claim 1, wherein the combiner comprises a signal modifier and a signal selector.

* * * * *